United States Patent
Inoue et al.

(10) Patent No.: US 8,062,777 B2
(45) Date of Patent: Nov. 22, 2011

(54) SEMICONDUCTOR THIN FILM AND PROCESS FOR PRODUCING THE SAME

(75) Inventors: Kazuyoshi Inoue, Sodegaura (JP); Koki Yano, Sodegaura (JP); Nobuo Tanaka, Sodegaura (JP); Tokie Tanaka, legal representative, Sodegaura (JP)

(73) Assignee: Idemitsu Kosan, Co., Ltd., Tokyo (JP)

( * ) Notice: Subject to any disclaimer, the term of this patent is extended or adjusted under 35 U.S.C. 154(b) by 242 days.

(21) Appl. No.: 12/090,731

(22) PCT Filed: Aug. 7, 2006

(86) PCT No.: PCT/JP2006/315585
§ 371 (c)(1),
(2), (4) Date: Apr. 18, 2008

(87) PCT Pub. No.: WO2007/046181
PCT Pub. Date: Apr. 26, 2007

(65) Prior Publication Data
US 2009/0127548 A1    May 21, 2009

(30) Foreign Application Priority Data

Oct. 19, 2005   (JP) ................................. 2005-304369

(51) Int. Cl.
*B32B 19/00* (2006.01)
(52) U.S. Cl. ........ 428/702; 428/697; 428/699; 428/701; 204/192.25
(58) Field of Classification Search .......... 428/697–699, 428/701–702; 204/192.25
See application file for complete search history.

(56) References Cited

U.S. PATENT DOCUMENTS

| | | | | |
|---|---|---|---|---|
| 5,397,920 A | * | 3/1995 | Tran | 257/749 |
| 5,667,853 A | * | 9/1997 | Fukuyoshi et al. | 428/1.62 |
| 6,669,830 B1 | * | 12/2003 | Inoue et al. | 204/298.13 |
| 7,008,833 B2 | * | 3/2006 | Li et al. | 438/197 |
| 7,217,344 B2 | * | 5/2007 | Sasaki et al. | 204/192.26 |
| 7,276,187 B2 | * | 10/2007 | Abe | 252/520.5 |
| 7,306,861 B2 | * | 12/2007 | Inoue et al. | 428/702 |
| 7,889,298 B2 | * | 2/2011 | Umeno et al. | 349/122 |
| 2004/0086717 A1 | | 5/2004 | Sasaki | |
| 2005/0151210 A1 | | 7/2005 | Li | |

FOREIGN PATENT DOCUMENTS

| | | |
|---|---|---|
| EP | 0733931 A2 | 9/1996 |
| EP | 1536034 A1 | 6/2005 |
| EP | 1939319 A1 | 9/2009 |
| JP | 9-150477 | 6/1997 |
| JP | 2004-119525 | 4/2004 |
| JP | 2004/149883 | 5/2004 |
| JP | 2005/242264 | 9/2005 |
| JP | 2005/243187 | 9/2005 |
| JP | 2005/290458 | 10/2005 |
| WO | 2004/042108 A2 | 5/2004 |

OTHER PUBLICATIONS

Office Action from China Patent Office dated Oct. 9, 2009.
Tanaka, Shinchiro, et. al, Characterization of sensor using doped, Journal of Materials Research, May 2001, pp. 1289-1935, vol. 16 No. 5, Japan.

* cited by examiner

*Primary Examiner* — Cathy Lam
(74) *Attorney, Agent, or Firm* — Millen, White, Zelano & Branigan, P.C.

(57) ABSTRACT

This invention provides a transparent oxide semiconductor, which comprises an oxide comprising indium oxide as a main component and cerium oxide as an additive and has such properties that light-derived malfunction does not occur, there is no variation in specific resistance of a thin film caused by heating and the like, and the mobility is high, and a process for producing the same. A semiconductor thin film characterized by comprising indium oxide and cerium oxide and being crystalline and having a specific resistance of $10^{+1}$ to $10^{+8}$ Ωcm is used. This semiconductor thin film has no significant change in specific resistance and has high mobility. Accordingly, an element having improved switching properties can be provided by constructing a switching element using this semiconductor thin film.

11 Claims, 2 Drawing Sheets

FIG.1

|  | TARGET COMPOSITION Ce/(Ce+In) | THIRD COMPONENT AND COMPOSITION | |
|---|---|---|---|
|  |  | COMPONENT(M) | M/(Ce+In+M) |
| SAMPLE1 | 0.01 | - | - |
| SAMPLE2 | 0.03 | - | - |
| SAMPLE3 | 0.05 | - | - |
| SAMPLE4 | 0.1 | - | - |
| SAMPLE5 | 0.02 | Sm | 0.01 |
| SAMPLE6 | 0.02 | Ga | 0.01 |
| SAMPLE7 | 0 | - | - |
| SAMPLE8 | 0.5 |  |  |

FIG.2

| | USING TARGET | OXYGEN PARTIAL PRESSURE (%) | FILM-FORMING TEMPERATURE (°C) | SPECIFIC RESISTANCE (Ωcm) | TRANSMITTANCE (%) at 550nm | CRYSTAL | AFTER HEATING AT 300°C FOR 1 HOUR SPECIFIC RESISTANCE (Ωcm) | CRYSTAL | MOBILITY (cm²/V·sec) | CARRIER DENSITY (/cm³) |
|---|---|---|---|---|---|---|---|---|---|---|
| EXAMPLE1 | SAMPLE1 | 10 | 200 | $10^{+2}$ | 85% | FOUND | $10^{+2}$ | FOUND | 23 | $10^{+15}$ |
| EXAMPLE2 | SAMPLE2 | 10 | 200 | $10^{+2}$ | 85% | FOUND | $10^{+2}$ | FOUND | 25 | $10^{+15}$ |
| EXAMPLE3 | SAMPLE3 | 10 | 200 | $10^{+4}$ | 85% | FOUND | $10^{+4}$ | FOUND | 14 | $10^{+14}$ |
| EXAMPLE4 | SAMPLE4 | 10 | 200 | $10^{+5}$ | 85% | FOUND | $10^{+5}$ | FOUND | 12 | $10^{+13}$ |
| EXAMPLE5 | SAMPLE5 | 10 | 200 | $10^{+6}$ | 86% | FOUND | $10^{+6}$ | FOUND | 10 | $10^{+13}$ |
| EXAMPLE6 | SAMPLE6 | 10 | 200 | $10^{+2}$ | 87% | FOUND | $10^{+2}$ | FOUND | 26 | $10^{+15}$ |
| EXAMPLE7 | SAMPLE2 | 20 | 200 | $10^{+2}$ | 85% | FOUND | $10^{+2}$ | FOUND | 28 | $10^{+15}$ |
| COMPARATIVE EXAMPLE1 | SAMPLE2 | 3 | 200 | $10^{-2}$ | 85% | FOUND | $10^{-2}$ | FOUND | 39 | $10^{+18}$ |
| COMPARATIVE EXAMPLE2 | SAMPLE2 | 0 | ROOM TEMPERATURE | $10^{-3}$ | 85% | NOT FOUND | $10^{-2}$ | FOUND | 12 | $10^{+18}$ |
| COMPARATIVE EXAMPLE3 | SAMPLE7 | 0 | ROOM TEMPERATURE | $10^{-3}$ | 85% | NOT FOUND | $10^{-1}$ | FOUND | 30 | $10^{+18}$ |
| COMPARATIVE EXAMPLE4 | SAMPLE8 | 0 | ROOM TEMPERATURE | $10^{-4}$ | 85% | FOUND | $10^{-2}$ | FOUND | 15 | $10^{+18}$ |

SEMICONDUCTOR THIN FILM AND PROCESS FOR PRODUCING THE SAME

TECHNICAL FIELD

The present invention relates to a semiconductor device, in particular, a semiconductor element made of a crystalline thin film, and an application of the semiconductor element to a display device or the like.

BACKGROUND ART

In recent years, display devices have been remarkably developed, and various display devices such as a liquid crystal display device or an EL display device have been actively introduced into OA instruments such as a computer, flat television sets, and others. These display devices each have, as a basic structure, a sandwich structure wherein a display element is sandwiched between transparent conductive films.

As switching elements for driving these display devices, elements each using a thin film are widely used from the viewpoint of downsizing or others.

Hitherto, the thin film has been technically investigated about the composition thereof, the production process thereof, and others since the film produces a large effect onto the performance and the production process of the switching elements.

Thin Film in the Prior Art

As the switching element for driving display devices at present, elements using a silicon based semiconductor film are the main current. This is because the stability and the workability of the silicon based thin film are good and additionally the elements have a large switching speed and other good performances. This silicon based thin film is generally produced by chemical vapor deposition (CVD).

As an element better in stability than the silicon based thin film, a transparent semiconductor thin film is suggested. Such a semiconductor thin film is described in, for example, Patent Document 1 described below.

Patent Document: Japanese Patent Application Laid-Open No. 2004-119525

DISCLOSURE OF THE INVENTION

Problems to be Solved by the Invention

However, when the silicon based thin film is amorphous, the film has drawbacks that the switching speed is relatively small and thus when high-speed moving images or the like are displayed, the switching element may not follow the movement thereof.

In the meantime, in the case of crystalline silicon based thin films, the switching speed is relatively large. However, when silicon is crystallized, a high temperature of 800° C. or higher, heating by action of a laser, and others are necessary. Thus, there remains a problem that a great deal of energy and a large number of steps are required.

Silicon based thin films have excellent performances as voltage elements. However, it is known that when an electric current is caused to flow thereto, a change in characteristics thereof by the passage of time may become a problem.

In recent years, attention has been paid to transparent semiconductor thin films as films better in stability than silicon based thin films (See above Patent Document 1). According to this Patent Document 1, it is stated that the transparent semiconductor thin film described in Patent Document 1 has a high transmittance equivalent to that of ITO films.

Moreover, Patent Document 1 gives, as a target of a material suitable for yielding this transparent semiconductor thin film, a sputtering target composed of indium oxide and gallium oxide, a sputtering target made of zinc oxide, a target composed of zinc oxide and magnesium oxide, and others. Patent Document 1 also describes a process of using these sputtering targets to produce semiconductor thin films.

However, about the transparent semiconductor thin film made of:
indium oxide and gallium oxide,
zinc oxide, or
zinc oxide and magnesium oxide,
the mobility thereof is at highest about 10 $cm^2$/V·sec. Although the mobility is higher than that of amorphous Si, the mobility is far smaller than that of poly Si (polysilicon). Furthermore, the mobility is changed by heating or the like, so that the semiconductor may undergo malfunction. When light goes into the layer of the semiconductor, the semiconductor may undergo wrong operation.

In light of such a situation, the present invention has been made. An object thereof is to provide a transparent oxide semiconductor that does not undergo wrong operation based on light by action of an oxide which is made mainly of indium oxide and contains incorporated cerium oxide; and a process for producing the same.

Another object of the invention is to provide a transparent oxide semiconductor stabilized without any change in thin-film specific resistance by heating or the like, and a process for producing the same.

Still another object of the invention is to provide a transparent oxide semiconductor high in thin-film mobility, and a process for producing the same.

Means for Solving the Problems (1) In order to solve the above-mentioned problems, the semiconductor thin film of the present invention is a semiconductor thin film, which comprises indium oxide and cerium oxide and is crystalline, and has a specific resistance of $10^{+1}$ to $10^{+8}$ Ωcm.

If the specific resistance of the semiconductor thin film is less than $10^{+1}$ Ωcm, the electric conductivity is made too high so that performances as a semiconductor are not exhibited. Conversely, an element giving a large leakage current may be produced.

If the specific resistance is more than $10^{+8}$ Ωcm, the electric non-conductance is too strong so that the thin film may not operate as a semiconductor.

The value of the specific resistance of the semiconductor thin film is preferably from $10^{+1}$ to $10^{+7}$ Ωcm, more preferably from $10^{+2}$ to $10^{+6}$ Ωcm.

(2) The invention is also the semiconductor thin film according to item (1), wherein the atomic ratio (the ratio between the numbers of the individual atoms) in the film is as follows: Ce/(Ce+In)=0.005 to 0.1.

The expression of Ce/(Ce+In) is an expression representing the ratio between the numbers of the individual atoms, that is, the atomic ratio of the cerium atoms to the entire composition. In this expression, Ce represents the number of the cerium atoms, and In represents the number of the indium atoms.

(3) The invention is also the semiconductor thin film according to item (1) or (2), wherein the atomic ratio of cerium in the semiconductor thin film is as follows: Ce/(Ce+In)=0.01 to 0.05.

If the atomic ratio in the semiconductor thin film is represented by the following: Ce/(Ce+In)<0.005, the specific resistance of the semiconductor thin film is not stably controlled into the above-mentioned range with ease. If the atomic ratio in the semiconductor thin film is represented by the following: Ce/(Ce+In)>0.1, the specific resistance of the semiconductor thin film is not stably controlled into the above-mentioned range with ease. Thus, the mobility may fall.

The numerical range of the cerium atomic ratio in the semiconductor thin film is more preferably as follows: Ce/(Ce+In)=0.01 to 0.05.

A third component may be added to the thin film of the invention. The third component means a third component besides indium and cerium.

The third component is preferably a positively trivalent metal oxide. A typical example of the positively trivalent metal oxide is an oxide of Al, Ga or Y. A positively trivalent lanthanoid element such as Nd or Sm is preferably selected.

The added amount of the positively trivalent metal oxide as the third component is not limited as long as the amount produces no effect onto the performances. Preferably, the atomic ratio of the third component, that is, the value of an expression of "the third component/(Ce+In+the third component)" ranges from 0.01 to 0.1. More preferably, this atomic ratio ranges from 0.01 to 0.05.

If the atomic ratio of this third component is more than 0.1, the thin film may not be crystallized or the specific resistance may be not stabilized when the thin film is heated.

(4) The invention is also the semiconductor thin film according to any one of items (1) to (3), which is a bixbite type crystal of indium oxide.

The semiconductor thin film operates as a semiconductor even if the thin film is amorphous. However, the mobility is small so that the switching speed may become small. It is therefore preferred that the semiconductor thin film is crystalline. In this case, this crystalline structure is preferably a bixbite type structure.

In this case, it can be decided by X-ray diffraction whether the thin film is crystalline or amorphous in accordance with whether a (222) peak out of crystal peaks is present or not and a (400) peak out of the crystal peaks is present or not.

(5) The invention is also a process for producing a semiconductor thin film as recited in any one of items (1) to (4), which is a process of using a target comprising indium oxide and cerium oxide to produce the thin film by a physical film-forming method, wherein the film is formed in the state that the oxygen concentration in an atmosphere during the formation of the film is more than 5% by volume.

The film is preferably formed at such a concentration that the oxygen concentration is more than 5% by volume. If the oxygen concentration is 5% or less by volume, the conductivity of the resultant semiconductor thin film is made too high so that the thin film may come not to operate as a semiconductor.

(6) The invention is also the process for producing a semiconductor thin film according to item (5), wherein the film is formed in the state that the oxygen concentration in the atmosphere during the formation of the film is from 10 to 30% by volume.

(7) The invention is also the process for producing a semiconductor thin film according to item (5) or (6), wherein the film is formed in the state that the oxygen concentration in the atmosphere during the formation of the film is from 10 to 20% by volume.

If the oxygen concentration is more than 30% by volume, plasma may be unstable when the target is sputtered or abnormal discharge may be caused. The numerical range of the oxygen concentration is more preferably from 10 to 20% by volume.

When the concentration is set into such a range, the control of the oxygen concentration value makes it possible to adjust the carrier density in the oxygen semiconductor into less than $10^{+18}/cm^3$. Moreover, the mobility becomes more than 10 $cm^2/V\cdot sec$. Thus, the film is suitable as a semiconductor thin film. More preferably, the carrier concentration in the oxygen semiconductor is set into a value less than $10^{+17}/cm^3$, and the mobility is set into a value more than 10 $cm^2/V\cdot sec$.

The method for the crystallization is preferably a method of giving energy by heating or radiating a lamp light ray, a laser ray or the like in the presence of oxygen.

(8) The invention is also a process for producing a semiconductor thin film as recited in any one of items (1) to (4), which is a process of using a target comprising indium oxide and cerium oxide to produce the thin film by a physical film-forming method, wherein the film is formed in the state that the temperature of a substrate during the formation of the film is 150° C. or higher.

(9) The invention is also a process for producing a semiconductor thin film as recited in any one of items (1) to (4), which is a process of using a target comprising indium oxide and cerium oxide to produce the thin film by a physical film-forming method, wherein after the formation of the film a substrate is heated to a temperature of 200° C. or higher.

Advantageous Effects of the Invention

As described above, the transparent oxide semiconductor obtained by the invention is excellent in thermal stability, maintains a specific resistance in the semiconductor region, and has a high transparency and a high mobility.

Also, according to the invention, the above-mentioned transparent oxide semiconductor can easily be obtained by controlling the concentration of oxygen when a film thereof is produced.

BRIEF DESCRIPTION OF THE DRAWINGS

FIG. 1 This is a table showing the composition of each target formed in the present embodiment.

FIG. 2 This is a table showing measured values and others of thin films formed by use of the targets formed in the present embodiment.

BEST MODE FOR CARRYING OUT THE INVENTION

Hereinafter, a preferred embodiment of the invention will be described on the basis of the drawings.

(1) Preparation of the Production of Transparent Oxide Semiconductors
(Formation of Targets)

First, a target sample 1 was formed.

Powders (average particle diameter: 1 μm or less) of indium oxide and cerium oxide were charged into a wet ball mill vessel to set a mole ratio of Ce/(In+Ce) to 0.01, and then the powders were mixed and pulverized over 72 hours.

Next, the thus-obtained pulverized product was granulated, and then the resultant was press-molded into a size 4 inches in diameter and 5 mm in thickness. This was put into a firing furnace, and then heated at a temperature of 1400° C. for 36 hours to form a target.

Ce/(In+Ce) is an atomic number ratio, and this value is equal to the above-mentioned mole ratio in the present embodiment.

In the same manner, the composition of indium oxide and cerium oxide was changed to form target samples 2 to 8.

As illustrated in FIG. 1, sample 1 was a target wherein the mole ratio between indium oxide and cerium oxide was 0.01.

Sample 2 was a target wherein the mole ratio between indium oxide and cerium oxide was 0.03.

Sample 3 was a target wherein the mole ratio between indium oxide and cerium oxide was 0.05.

Sample 4 was a target wherein the mole ratio between indium oxide and cerium oxide was 0.1.

Sample 5 was a target wherein the mole ratio between indium oxide and cerium oxide was 0.02, and further samarium oxide was added thereto as a third component. The added amount of this samarium oxide was adjusted to set the mole ratio represented by Sm/(In+Ce+Sm) to 0.01.

Sample 6 was a target wherein the mole ratio between indium oxide and cerium oxide was 0.02, and further gallium oxide was added thereto as a third component. The added amount of this gallium oxide was adjusted to set the mole ratio represented by Ga/(In+Ce+Ga) to 0.01.

Sample 7 was a target wherein the mole ratio between indium oxide and cerium oxide was 0. In short, sample 7 was made only of indium oxide.

Sample 8 was a target wherein the mole ratio between indium oxide and cerium oxide was 0.5.

As described above, 8 type targets of target samples 1 to 8 were totally formed.

(2) Production of Transparent Oxide Semiconductors Thin Films

Next, the targets yielded in the item (1) were each fitted into a sputtering machine. Once the machine was made into a vacuum having a vacuum degree of $10^{-4}$ Pa, and then argon gas and oxygen were introduced thereinto so as to adjust the pressure into 0.3 Pa. Next, a power of 100 W was applied thereto by RF magnetron sputtering, so as to produce a thin film 200 nm in thickness on the sample. Conditions for producing the thin film, and measured values of the thin film are shown in FIG. 2. The method for measuring whether or not the thin film was crystallized was according to the X-ray diffraction method.

First, working examples will be described.

As illustrated in FIG. 2, Example 1 was a thin film using the target of sample 1. The partial pressure of oxygen was 10%, and the film was formed at a film-forming temperature of 200° C. As a result, the obtained thin film was a thin film having a specific resistance of $10^{+2}$ Ωcm. The transmittance of this thin film to light having a wavelength of 550 nm was 85%, and the film was crystallized. The film was heated at 300° C. for 1 hour, and subsequently the specific resistance was $10^{+2}$ Ωcm, which was not varied from the value before the heating. The film was in a crystalline state in the same manner as before the heating; however, the crystal peak thereof became sharper. Thus, the crystallinity was improved.

As illustrated in FIG. 2, Example 2 was a thin film using the target of sample 2. The partial pressure of oxygen was 10%, and the film was formed at a film-forming temperature of 200° C. As a result, the obtained thin film was a thin film having a specific resistance of $10^{+2}$ Ωcm. The transmittance of this thin film to light having a wavelength of 550 nm was 85%, and the film was crystallized. The film was heated at 300° C. for 1 hour, and subsequently the specific resistance was $10^{+2}$ Ωcm, which was not varied from the value before the heating. The film was in a crystalline state in the same manner as before the heating; however, the crystal peak thereof became sharper. Thus, the crystallinity was improved.

As illustrated in FIG. 2, Example 3 was a thin film using the target of sample 3. The partial pressure of oxygen was 10%, and the film was formed at a film-forming temperature of 200° C. As a result, the obtained thin film was a thin film having a specific resistance of $10^{+4}$ Ωcm. The transmittance of this thin film to light having a wavelength of 550 nm was 85%, and the film was crystallized. The film was heated at 300° C. for 1 hour, and subsequently the specific resistance was $10^{+4}$ Ωcm, which was not varied from the value before the heating. The film was in a crystalline state in the same manner as before the heating; however, the crystal peak thereof became sharper. Thus, the crystallinity was improved.

As illustrated in FIG. 2, Example 4 was a thin film using the target of sample 4. The partial pressure of oxygen was 10%, and the film was formed at a film-forming temperature of 200° C. As a result, the obtained thin film was a thin film having a specific resistance of $10^{+5}$ Ωcm. The transmittance of this thin film to light having a wavelength of 550 nm was 85%, and the film was crystallized. The film was heated at 300° C. for 1 hour, and subsequently the specific resistance was $10^{+5}$ Ωcm, which was not varied from the value before the heating. The film was in a crystalline state in the same manner as before the heating; however, the crystal peak thereof became sharper. Thus, the crystallinity was improved.

As illustrated in FIG. 2, Example 5 was a thin film using the target of sample 5. The partial pressure of oxygen was 10%, and the film was formed at a film-forming temperature of 200° C. As a result, the obtained thin film was a thin film having a specific resistance of $10^{+6}$ Ωcm. The transmittance of this thin film to light having a wavelength of 550 nm was 86%, and the film was crystallized. The film was heated at 300° C. for 1 hour, and subsequently the specific resistance was $10^{+6}$ Ωcm, which was not varied from the value before the heating. The film was in a crystalline state in the same manner as before the heating; however, the crystal peak thereof became sharper. Thus, the crystallinity was improved.

As illustrated in FIG. 2, Example 6 was a thin film using the target of sample 6. The partial pressure of oxygen was 10%, and the film was formed at a film-forming temperature of 200° C. As a result, the obtained thin film was a thin film having a specific resistance of $10^{+2}$ Ωcm. The transmittance of this thin film to light having a wavelength of 550 nm was 87%, and the film was crystallized. The film was heated at 300° C. for 1 hour, and subsequently the specific resistance was $10^{+2}$ Ωcm, which was not varied from the value before the heating. The film was in a crystalline state in the same manner as before the heating; however, the crystal peak thereof became sharper. Thus, the crystallinity was improved.

As illustrated in FIG. 2, Example 7 was a thin film using the target of sample 2. The partial pressure of oxygen was 20%, and the film was formed at a film-forming temperature of 200° C. As a result, the obtained thin film was a thin film having a specific resistance of $10^{+2}$ Ωcm. The transmittance of this thin film to light having a wavelength of 550 nm was 85%, and the film was crystallized. The film was heated at 300° C. for 1 hour, and subsequently the specific resistance was $10^{+2}$ Ωcm, which was not varied from the value before the heating. The film was in a crystalline state in the same manner as before the heating; however, the crystal peak thereof became sharper. Thus, the crystallinity was improved.

Moreover, as shown in FIG. 2, the carrier densities of these working examples obtained by hole measurement were each less than $10^{+18}/cm^3$, and the mobilities thereof were each more than 10 $cm^2/V \cdot sec$.

Next, comparative examples will be described.

As illustrated in FIG. 2, Comparative example 1 was a thin film using the target of sample 2. The partial pressure of oxygen was 3%, and the film was formed at a film-forming temperature of 200° C. As a result, the obtained thin film was a thin film having a specific resistance of $10^{-2}$ Ωcm. The transmittance of this thin film to light having a wavelength of 550 nm was 85%, and the film was crystallized. The film was heated at 300° C. for 1 hour, and subsequently the specific resistance was $10^{-2}$ Ωcm, which was not varied from the value before the heating. Moreover, the film was in a crystalline state in the same manner as before the heating.

As illustrated in FIG. 2, Comparative example 2 was a thin film using the target of sample 2. The partial pressure of oxygen was 0%, and the film was formed at a film-forming temperature of room temperature. As a result, the obtained thin film was a thin film having a specific resistance of $10^{-3}$ Ωcm. The transmittance of this thin film to light having a wavelength of 550 nm was 85%, and the film was not crystallized. The film was heated at 300° C. for 1 hour, and subsequently the specific resistance was $10^{-2}$ Ωcm, which was varied from the value before the heating. Moreover, the film, which was not crystallized, changed into a crystalline state after the heating for 1 hour.

As illustrated in FIG. 2, Comparative example 3 was a thin film using the target of sample 7. The partial pressure of oxygen was 0%, and the film was formed at a film-forming temperature of room temperature. As a result, the obtained thin film was a thin film having a specific resistance of $10^{-3}$ Ωcm. The transmittance of this thin film to light having a wavelength of 550 nm was 85%, and the film was not crystallized. The film was heated at 300° C. for 1 hour, and subsequently the specific resistance was $10^{-1}$ Ωcm, which was varied from the value before the heating. Moreover, the film, which was not crystallized, changed into a crystalline state after the heating for 1 hour.

As illustrated in FIG. 2, Comparative example 4 was a thin film using the target of sample 8. The partial pressure of oxygen was 0%, and the film was formed at a film-forming temperature of room temperature. As a result, the obtained thin film was a thin film having a specific resistance of $10^{-4}$ Ωcm. The transmittance of this thin film to light having a wavelength of 550 nm was 85%, and the film was not crystallized. The film was heated at 300° C. for 1 hour, and subsequently the specific resistance was $10^{-2}$ Ωcm. Moreover, it was verified by X-ray diffraction that the film, which was not crystallized, changed into a crystalline state.

As illustrated in FIG. 2, in these comparative examples, the mobilities thereof were each more than 10 cm$^2$/V·sec; however, the carrier densities thereof obtained by hole measurement were each $10^{+18}$/cm$^3$.

The invention claimed is:

1. A semiconductor thin film, which comprises indium oxide and cerium oxide and is crystalline which is a bixbit type crystal of indium oxide, wherein the atomic ratio of cerium in the thin film is Ce/(Ce+In)=0.005 to 0.1; and the thin film has a specific resistance of $10^{+1}$ to $10^{+8}$ Ωcm.

2. The semiconductor thin film according to claim 1, wherein the atomic ratio of cerium in the film is as follows: Ce/(Ce+In)=0.01 to 0.05.

3. The semiconductor thin film according to claim 1, wherein the specific resistance of the semiconductor thin film is from $10^{+1}$ to $10^{+7}$ Ωcm.

4. The semiconductor thin film according to claim 1, wherein the specific resistance of the semiconductor thin film is from $10^{+2}$ to $10^{+6}$ Ωcm.

5. The semiconductor thin film according to claim 1, wherein the thin film further comprises a trivalent element selected from Al, Ga, Y, Nd and Sm.

6. The semiconductor thin film according to claim 5, wherein the atomic ratio of the trivalent element is from 0.01 to 0.1.

7. A process for producing a semiconductor thin film as claimed in claim 1, which comprises performing a physical film-forming step on a target comprising indium oxide and cerium oxide to product the thin film on a substrate, wherein the thin film is formed in an atmosphere that an oxygen concentration during the formation of the thin film is more than 5% by volume.

8. The process for producing a semiconductor thin film according to claim 7, wherein the thin film is formed in the atmosphere that an oxygen concentration during the formation of the thin film is from 10 to 30% by volume.

9. The process for producing a semiconductor thin film according to claim 7, wherein the thin film is formed in the atmosphere that an oxygen concentration during the formation of the thin film is from 10 to 20% by volume.

10. A process for producing a semiconductor thin film as claimed in claim 7, wherein during the formation of the thin film, the substrate is heated to a temperature of 150° C. or higher.

11. A process for producing a semiconductor thin film as claimed in claim 7, wherein after the formation of the thin film on the substrate, the substrate and the thin film are heated to a temperature of 200° C. or higher.

* * * * *